United States Patent
Shi (10) Patent No.: US 7,532,011 B2
(45) Date of Patent: May 12, 2009

(54) METHOD AND APPARATUS FOR TIME DOMAIN REFLECTION TEST OF TRANSMISSION LINE

(75) Inventor: Qingquan Shi, Guangdong Province (CN)

(73) Assignee: TDK Corporation, Tokyo (JP)

( * ) Notice: Subject to any disclaimer, the term of this patent is extended or adjusted under 35 U.S.C. 154(b) by 238 days.

(21) Appl. No.: 11/588,106

(22) Filed: Oct. 26, 2006

(65) Prior Publication Data
US 2007/0108989 A1   May 17, 2007

(30) Foreign Application Priority Data
Oct. 28, 2005   (CN) .................. 2005 1 0116787

(51) Int. Cl.
*G01R 31/11* (2006.01)
(52) U.S. Cl. ...................... 324/533; 324/534
(58) Field of Classification Search ................. 324/533, 324/532, 527, 512, 500, 534, 637, 642, 539
See application file for complete search history.

(56) References Cited

U.S. PATENT DOCUMENTS 5,083,086 A * 1/1992 Steiner ................ 324/533
2006/0068790 A1 * 3/2006 Sawamoto et al. .......... 455/441
2006/0097730 A1 * 5/2006 Park et al. ................ 324/534
2006/0098725 A1 * 5/2006 Rhee et al. ................ 375/222
2006/0182269 A1 * 8/2006 Lo et al. ............... 379/406.08
2007/0051193 A1 * 3/2007 Olenick et al. ............. 73/866

FOREIGN PATENT DOCUMENTS

JP           59077367 A   *  5/1984
SU            660285 A   *  4/1979

* cited by examiner

*Primary Examiner*—Vincent Q Nguyen
*Assistant Examiner*—Hoai-An D Nguyen
(74) *Attorney, Agent, or Firm*—Brinks Hofer Gilson & Lione (57) ABSTRACT

The present invention relates to a method and an apparatus for TDR (time domain reflection) test of a transmission line. In the method, first, a test signal meeting the test requirement of self-correlation and mutual-correlation is determined and transmitted in the transmission line, in which the test signal may be a band-limited random signal, a frequency agility signal, or a regular frequency modulation signal. Then, a TDR test is performed according to the test signal transmitted in the transmission line. The SELT (Single-End Line Test) apparatus configured in accordance with the TDR test solution in the present invention has a good adaptability to environment, a high test accuracy, and an excellent capability of noise resistance. The method of the present invention is very useful for TDR test of large-scaled DSLAM (DSL Access Multiplexer) equipments.

18 Claims, 5 Drawing Sheets

METHOD AND APPARATUS FOR TIME DOMAIN REFLECTION TEST OF TRANSMISSION LINE

CROSS-REFERENCE TO RELATED APPLICATIONS

This application claims priority to Chinese Patent Application priority number 200510116787.9, filed Oct. 28, 2005, the disclosures of which are hereby incorporated herein by reference.

FILED OF THE INVENTION

The present invention relates to the communication technology field, particularly to a method and an apparatus for time domain reflection (TDR) test of a transmission line.

BACKGROUND OF THE INVENTION xDSL (Digital Subscriber Line) is a technique for high-speed data transmission through Unshielded Twist Pair (UTP). In addition to the base-band transmission DSLs, such as IDSL and SHDSL, the pass-band transmission xDSL utilizes the frequency division multiplexing (FDM) technique so that the xDSL service may coexist with the POTS (Plain Old Telephone Service) in a same twist pair. The xDSL service occupies the higher frequency band, while the POTS occupies the base band below 4 KHz. The POTS signal and the xDSL signal may be separated from each other by a splitter.

Figure 1:
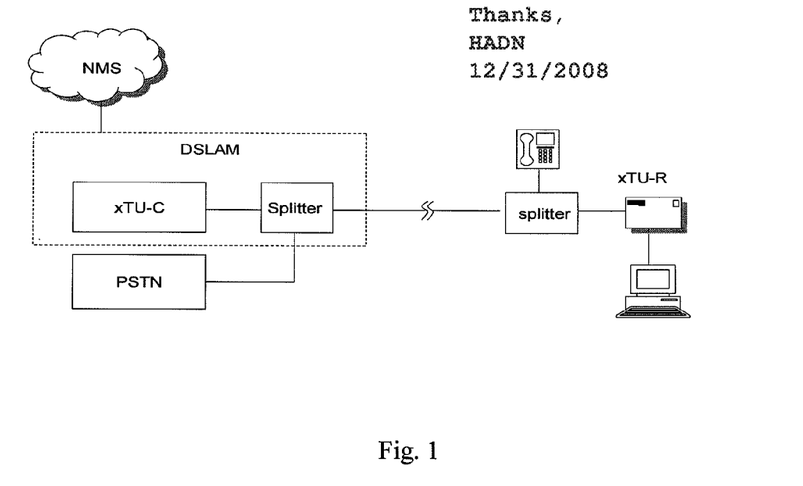
FIG. 1 is a schematic diagram of a reference model of an xDSL system in the prior art.

The pass-band transmission xDSL employs the discrete multi-tone (DMT) modulation. A system that provides multiple xDSL access is called a DSL access multiplexer (DSLAM), the system reference model of which is shown in FIG. 1.

It is well known that a higher line activation rate is generally desirable during the put-into-operation process of an xDSL service. To achieve a higher line activation rate, it is necessary to guarantee that the xDSL service be put into operation on more twist pairs of subscribers. In the actual application environment, however, xDSL service can not be put into operation normally on all the twist pairs of subscribers at an office.

Troubleshooting has to be carried out for the lines on which xDSL service can not be put into operation, or these lines have to be replaced completely, so as to enable the xDSL service to be put into operation. This process requires a great deal of manpower and material resources. As a result, the operating cost of the operators may be increased significantly.

In order to reduce the cost of troubleshooting, the Single-End Line test (SELT) technique is presented, that is, an automatic test means is employed to implement the testing, checking, and fault positioning of a line.

At present, the SELT test devices available in the market mainly employ TDR (Time Domain Reflection) method or Lumped Parameter Model estimation method for testing, in order to position a fault.

At present, a square wave, a sine wave, or a half-sine wave is usually used as the test signal in the existing TDR test devices. It can be seen that, (1) Since the self-correlation of these waveforms is not strong, the receiving end can not distinguish correctly if there is a superimposition in the echo.

(2) If a test loop is long, the echo signal will be weak; accordingly, the signal is susceptible to interference of external signals, especially in the case of a square wave.

(3) When any of these waveforms is used in the test, the durations of test signal should be selected differently according to the lengths of the test loops. Thus, for the unknown lines, trial tests have to be carried out repeatedly, which will cost a long time.

(4) For a complicated test loop (e.g., when there are two bridge taps), those test signals will not function well sometimes.

(5) The line test may have adverse effects on the working xDSL lines in the same cable.

SUMMARY OF THE INVENTION

An embodiment of the present invention provides a method and an apparatus for TDR (Time Domain Reflection) test of a transmission line, so as to carry out a TDR test of the transmission line more conveniently and accurately.

The technical solutions are as follows:

The method for Time Domain Reflection (TDR) test of a transmission line includes:
   determining a test signal which meets requirement of self-correlation and mutual-correlation according to test requirement in the transmission line, and transmitting the test signal;
   performing the TDR test according to the test signal transmitted in the transmission line The test signal may be any of the following signals:
   a random signal, a frequency agility signal, and a regular frequency modulation signal.

Preferably, the random signal is a band-limited random signal. The transmission line may be a copper line.

The process of performing the TDR test may include:
   receiving a returned signal reflected in reverse direction in the transmission line, performing a mutual-correlation operation for the returned signal and the test signal to identify the reflected wave of the test signal returned in the transmission line, and determining a result of the TDR test in accordance with a result of the mutual-correlation operation.

The apparatus for TDR test of a transmission line includes a predefined signal generator and a TDR test device, wherein:
   the predefined signal generator is configured to generate a test signal according to the requirement for self-correlation and mutual-correlation and feed the test signal to a TDR test device;
   the TDR test device is configured to perform TDR test according to the test signal generated by the predefined signal generator.

The predefined signal generator may include:
   a random signal generator and a band-pass filter; wherein a random signal generated by the random signal generator is band limited by the band-pass filter and outputted as the test signal.

Alternatively, the predefined signal generator may include:
   a frequency generator and a frequency-hopping pattern control module, wherein the frequency generator generates signals of preset frequencies, and a signal of specific frequencies is chosen from the above signals as a test signal under control of the frequency-hopping pattern control module.

Alternatively, the predefined signal generator may include:
   a frequency modulator and a frequency modulation rule module, wherein the frequency modulator is configured to perform a frequency modulation in accordance with the time function output from the frequency modulation rule module, to obtain a corresponding frequency modulation signal which is taken as the test signal.

The apparatus may further include:
a mutual-correlation operation module, configured to perform a mutual-correlation operation for reflected signal received by the TDR test device and the test signal.

Wherein, the mutual-correlation operation module may be disposed in the TDR test device or may be independent to the TDR test device. The transmission line may be a copper line.

It can be seen that the technical solutions of the present invention described above have the advantages of a high signal energy, a high distance resolution, and a better capability of noise resistance. Therefore, the SELT (Single-End Line Test) apparatus designed in accordance with the TDR test solution in the present invention has a good adaptability to environment, a high test accuracy, and an excellent capability of noise resistance. The method of the present invention is very useful for TDR test of large-scaled DSLAM (DSL Access Multiplexer) equipment.

DETAILED DESCRIPTION OF THE EMBODIMENTS

In the embodiments of the present invention, a set of test signals, each of which has a stronger self-correlation and a weaker mutual-correlation with other signals, are selected during the TDR test process. Thus, the test accuracy may be improved.

Hereinafter, the TDR test process will be described first to facilitate further understanding of the present invention.

Figure 2:
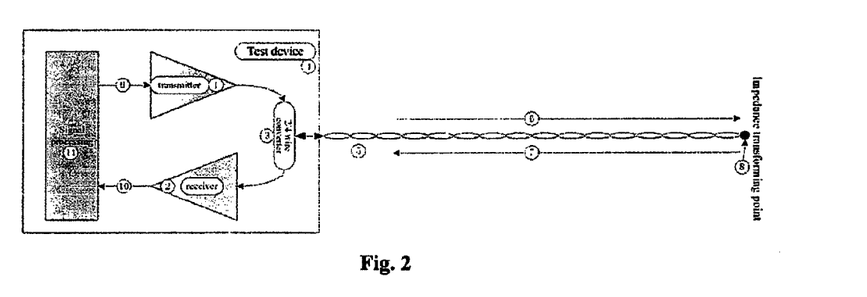
FIG. 2 is a schematic diagram of a TDR test model according to an embodiment of the present invention.

As shown in FIG. 2, in the TDR test, a transmitter 1 transmits a test signal which has been driven to a Two-Wire/Four-Wire Conversion 3, and then the test signal is driven onto a line 5. The test signal travels forward in the direction 6 and is reflected at an impedance transforming point 8. Then the signal travels in the reverse direction 7, and finally reaches a receiver 2 via the Two-Wire/Four-Wire Converter 3. In the returned signal, the reflected signal will be superimposed with the signal in the direction 6. The TDR test is to process the signal returned to the receiver 2 to obtain the test result, so that the fault point may be located, and so on.

The signal processing unit 11 shown in FIG. 2 is responsible for transmitting a test signal, analyzing a received signal, and producing the test result.

Hereunder the implementation procedure of a method according to an embodiment of the present invention is described.

In order to test the returned signal received by the receiver shown in FIG. 2, a set of band-limited test signals suitable for SELT are employed in an embodiment of the present invention. Each of these test signals has a strong self-correlation and a weaker mutual-correlation with the other signals.

Referring to FIG. 2, the specific TDR test procedure may be as follows:

First, the set of band-limited test signals suitable for SELT is transmitted from the transmitter 1. The signals are transmitted through the transmission line (e.g., a copper line), and will return in the direction 7 when they reach the impedance transforming point 8, and then will be received by the receiver 2.

Next, a mutual-correlation operation is performed for the signals received by the receiver 2. In particular, a mutual-correlation operation is performed for the received signals and the signals transmitted originally by the transmitter 1, so as to identify the signals reflected by the impedance transforming point 8, thus obtaining the corresponding result of the TDR test.

It can be seen that the test signals with stronger self-correlation and weaker mutual-correlation are employed in the TDR test, so as to obtain a more desirable test effect. Hereunder the test signals that can be used according to an embodiment of the present invention will be described.

(1) Band-limited Random Signal

The random signal includes, but is not limited to, the pseudo-random signal generated by some sequence generators. To meet the requirement of the test, a band-pass filtering process is required to be performed for the pseudo-random signal, and the filtered pseudo-random signal is utilized as the test signal.

(2) Frequency Agility Signal

The frequency agility signal can be at different frequencies in different time slices; before the frequency agility signal is designed, the desired frequencies are determined first; then, the signal at corresponding frequencies are generated by the frequency generator, and the relationship of frequency vs. time slice is determined in accordance with the frequency-hopping pattern, so as to obtain the frequency agility signal applicable to the test; the frequency-hopping pattern can be periodically fixed or can be generated randomly.

(3) Regular Frequency Modulation Signal

The regular frequency modulation signal $s(t)=A\cos(2\pi f(t)t+\phi_0)$, wherein, "A" is the amplitude, $\phi_0$ is the initial phase, $f(t)$ is the frequency modulation rule, which is a function of time. If $f(t)$ is a one-order linear function, $s(t)$ is a linear frequency modulation signal.

Figure 3:
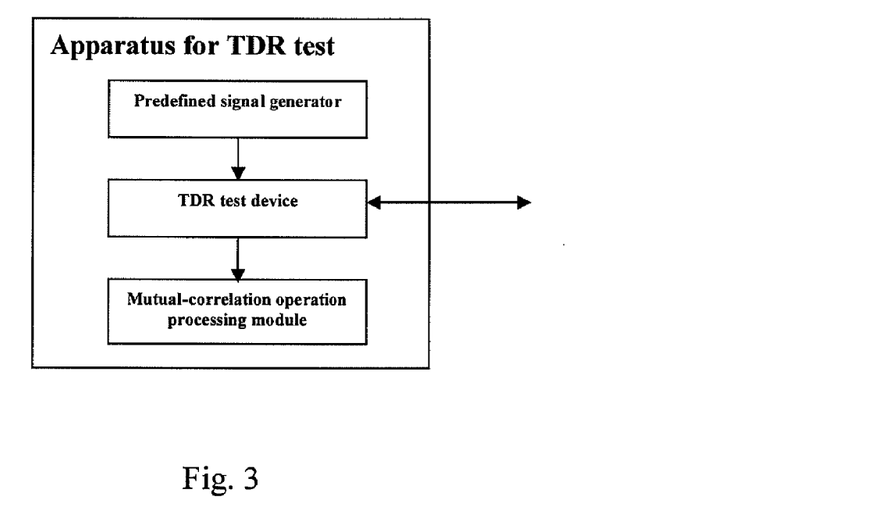
FIG. 3 is a structural representation of an apparatus according to an embodiment of the present invention according to an embodiment of the present invention.

Another embodiment of the present invention provides an apparatus for TDR test of transmission line. As shown in FIG. 3, the TDR test apparatus includes the following three components:

(1) A Predefined Signal Generator

Figure 4:
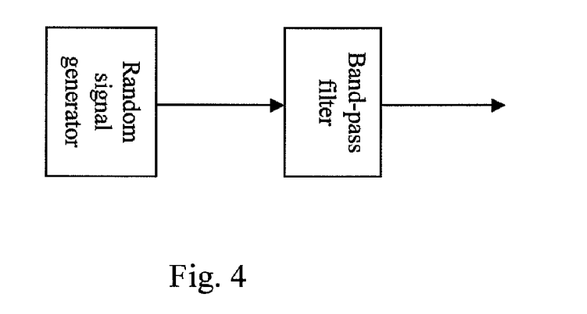
FIG. 4 is a structural diagram of a predefined signal generator according to an embodiment of the present invention.
Figure 5:
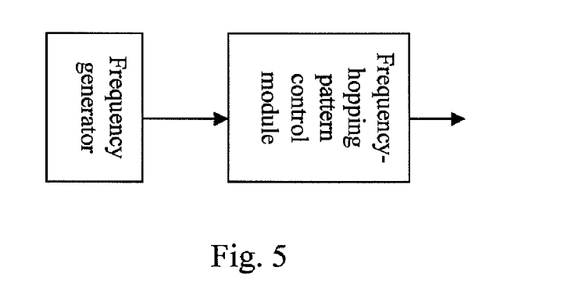
FIG. 5 is a structural diagram of another predefined signal generator according to an embodiment of the present invention.
Figure 6:
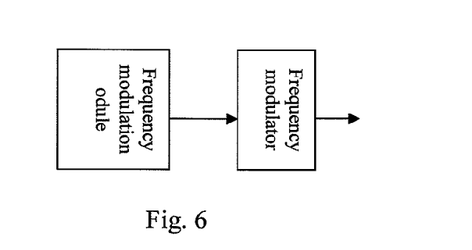
FIG. 6 is a structural diagram of another predefined signal generator according to an embodiment of the present invention.

The predefined signal generator is designed to generate a test signal meeting the requirement for self-correlation and mutual-correlation and feed the signal to a TDR (time domain reflection) test device. Furthermore, the predefined signal generator may have any of the following three structures, i.e., the structure as shown in FIG. 4, which includes a random signal generator and a band-pass filter; the random signal generated by the random signal generator is band limited by the band-pass filter, and then is outputted as the test signal;

or, the structure as shown in FIG. 5, which includes a frequency generator and a frequency-hopping pattern control module; the frequency generator generates signals at the preset frequencies; a signal at specific frequencies is chosen from above signals as the test signal under the control of the frequency-hopping pattern control module;

or, the structure as shown in FIG. 6, which includes a frequency modulation rule module and a frequency modulator; the frequency modulator is designed to perform frequency modulation in accordance with the time function output from the frequency modulation rule module, to obtain the corresponding frequency modulation signal as the test signal.

(2) a TDR (time domain reflection) test device, which is designed to perform a TDR test to the test signal generated by the predefined signal generator; this TDR test device is an existing device;

(3) a mutual-correlation operation processing module, which is designed to perform the mutual-correlation operation between the superimposed reflected signal received by the TDR test device and the test signal, to obtain the result of TDR test, that is, to identify the corresponding reflected signal from the returned signal; this module can be disposed in the TDR test device, or can be independent to the TDR test device.

To facilitate further understanding of the present invention, hereunder the implementation of TDR test by use of a band-limited pseudo-random signal (x(n)) will be described with reference to the drawings. The principle of the advantages of the test signals with stronger self-correlation and weaker mutual-correlation specified in the embodiments of the present invention will also be described. The processing procedures for other test signals are similar and will not be repeated herein.

Figure 7:
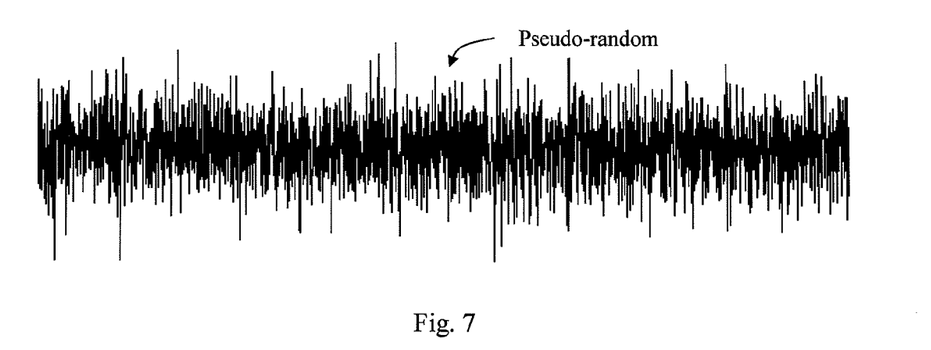
FIG. 7 is a schematic diagram of a pseudo-random signal according to an embodiment of the present invention.

In an embodiment of the present invention, a pseudo-random signal with strong self-correlation, i.e., (x(n) n=1 . . . N), is used as the test signal. FIG. 7 shows the time domain waveform of the band-limited pseudo-random signal.

Figure 8:
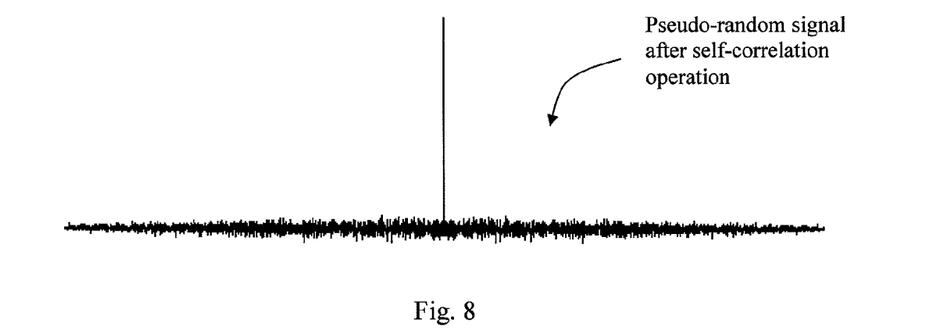
FIG. 8 is a schematic diagram of the self-correlation result of the pseudo-random signal according to an embodiment of the present invention.

A self-correlation operation is carried out for the pseudo-random signal by use of the formula $$\sum_{k=1}^{N} x(k)x(k+t);$$

the result of which is shown in FIG. 8. As shown in FIG. 8, the result has the time compression characteristic.

Figure 9:
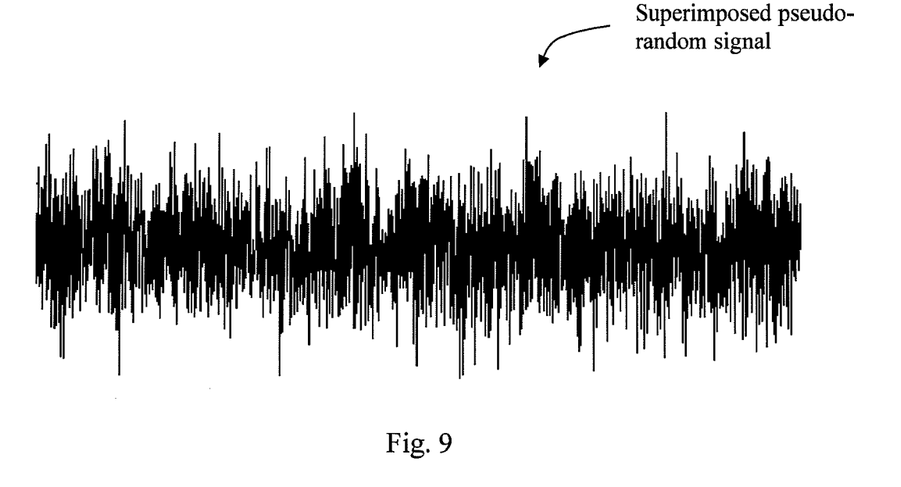
FIG. 9 is a schematic diagram of a superimposed pseudo-random signal which is aliased in time domain with the original signal after a time delay according to an embodiment of the present invention.
Figure 10:
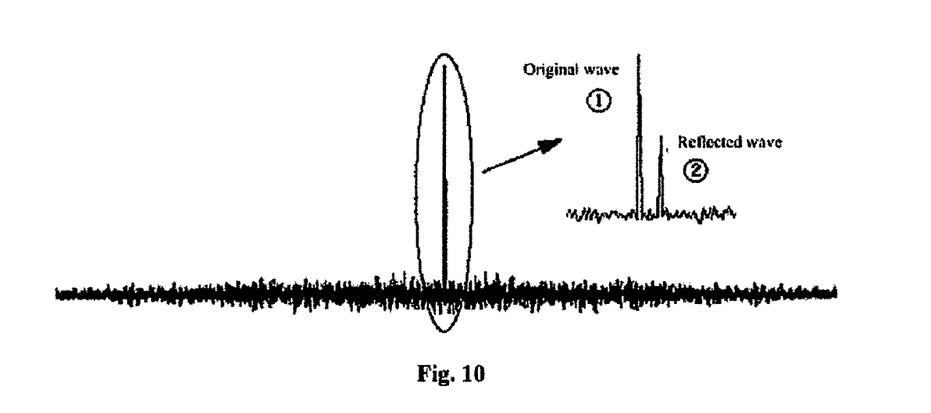
FIG. 10 is a schematic diagram of the result of mutual-correlation operation between the superimposed pseudo-random signal and the original signal according to an embodiment of the present invention.

After the pseudo-random signal is transmitted, the TDR receiver will receive the returned signal. As shown in FIG. 9, the returned signal is a time domain waveform y(n) resulted from the superimposition of two identical band-limited pseudo-random signals after different time delays, i.e., y(n) =a·x(n)+b·x(n−k) k<N; wherein, "a" and "b" are frequency-related leakage factor and reflection factor respectively. With regard to the received signal, the two signals with different time delays can not be distinguished merely through the judgment on time domain, i.e., the information of the reflected signal can not be obtained. This is because that the signals are aliased in time. To distinguish the reflected signal, a mutual-correlation operation has to be performed between x(n) and y(n), the result of which is shown in FIG. 10. It can be seen from the enlarged part in FIG. 10 that the two components of y(n), i.e., x(n) and x(n−k), are separated from each other. Wherein, the ① indicates x(n) (i.e., the leaked original waveform), and the ② indicates x(n−k) (i.e., reflected waveform).

In the embodiments of the present invention, the band-limited pseudo-random signal has a very weak mutual-correlation with other signals (mainly include some noise signals (n(n)) with certain characteristics, such as line noise, pulse noise, and cross-talk interference, etc.) in the SELT test environment, which can be denoted as $$\sum_{k=1}^{N} x(k)n(k+t) \to 0$$

(i.e., the result tends to 0). Therefore, the band-limited pseudo-random signal has little mutual-correlation with other signals in the SELT test environment.

Hereunder the advantages of the solutions of the present invention will be analyzed with reference to the attached drawings.

The solutions of the present invention mainly have the following three advantages:

(1) High Signal Energy

As shown in FIG. 2, the energy of the echo (7) reflected from the impedance transforming point (8) has to be high enough, so that it can be received correctly. To obtain enough signal energy, the signal amplitude or signal duration can be increased. It is apparent that the signal amplitude can not be increased unlimitedly in a SELT system. Actually, the signal energy shall be increased by increasing the signal duration because of a variety of factors such as the reducing of interference and the like. However, the test signals (e.g., square wave and sine wave, etc.) provided in the prior art can not be emitted for a long time in order to suppress the time domain aliasing with the reflected wave. Usually, to maintain a test accuracy of 50 m in a test loop of 1 km, the maximum duration of test signal is about 0.5 μs. However, with any of the three test signals provided in the embodiments of the present invention, the allowable duration of test signal can be up to more than ten microseconds or even longer.

(2) High Distance Resolution

Figure 11:
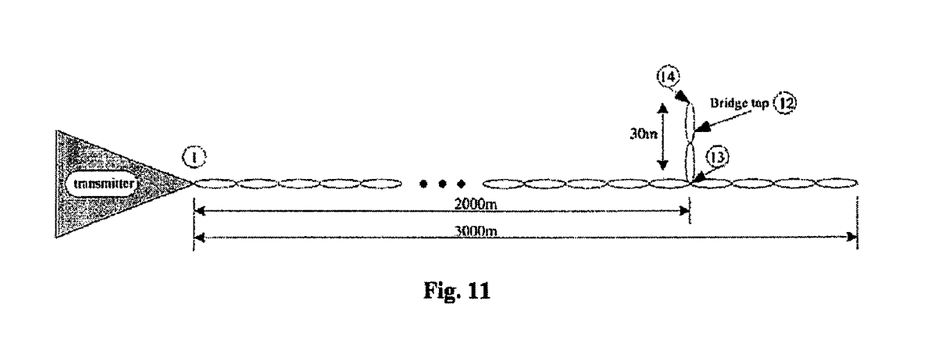
FIG. 11 is a schematic diagram of a line model of bridge taps according to an embodiment of the present invention.

When there are two consecutive impedance transforming points in the test line, the distance between the two points is short, as shown in FIG. 11. Suppose that the total length of the line is 3000 m, and there is a bridge tap 12 of 30 m at the location of 2000 m. The duration of test signal must be shorter than 0.5 μs in order to test the bridge tap 12 correctly if a test signal (e.g., square wave, sine wave, etc.) provided in the prior art is used. However, for a signal with such a low energy, the attenuation will be severe when the signal returns to the point 1 from the points 13 and 14. As a result, the returned signal can not be received correctly. In contrast, if any of the three test signals provided in the present invention, for example, a band-limited pseudo-random signal, is utilized, the signal returned to point 1 will have higher energy and can be received correctly due to the longer duration, even if the amplitude of the returned signal may be very low at point 1. Then, the time points of echoing at point 13 and point 14 can be distinguished from each other in accordance with the time compression characteristic of the band-limited pseudo-random signal.

(3) Better Ability of Noise Resistance

Even when the SNR (Signal Noise Ratio) of the received signal is lower than 0 (i.e., the signal is merged in the noise), the echo signal can be extracted from the received signal, because of the low mutual-correlation between the pseudo-random signal and the noise. However, in the case that a test signal (e.g., square wave, sine wave, etc.) provided in the prior art is utilized, the SNR must be higher than 0 in order to detect the echo signals correctly.

It can be seen that the SELT apparatus designed on the basis of the present invention has a good adaptability to environment, high test accuracy, and an excellent capability of noise resistance. A test can be accomplished in various complicated environments. That is, the use of the pseudo-random signal, the frequency agility signal, or the regular frequency modulation signal as the test signal in TDR test is valuable for the large-scaled DSLAM devices.

While the present invention has been described as above with reference to the preferred embodiments of the present invention, it shall be noted that the protection scope of the present invention should not be limited to these. It will be obvious to those skilled in the art to make any modifications or substitutions without departing from the scope of the present invention, and it is intended that the present invention shall encompass such modifications or substitutions. The protection scope of the present invention shall be defined by the following claims.

What is claimed is:

1. A method for Time Domain Reflection (TDR) test of a transmission line, comprising:
    determining a test signal which meets requirement of self-correlation and mutual-correlation according to test requirement in the transmission line, and transmitting the test signal to the transmission line;
    receiving a returned signal from the transmission line, the returned signal being a superposition signal of the test signal and a reflected signal of the test signal;
    identifying the reflected signal by performing a mutual-correlation operation for the returned signal and the test signal; and
    determining a test result according to the reflected signal.

2. The method according to claim 1, wherein the test signal is any one of the following three signals: a random signal, a frequency agility signal, and a regular frequency modulation signal.

3. The method according to claim 2, wherein the random signal is a band-limited random signal.

4. An apparatus for Time Domain Reflection (TDR) test of a transmission line, comprising a predefined signal generator and a TDR test device, wherein, the predefined signal generator is configured to generate a test signal according to requirement of self-correlation and mutual-correlation and feed the test signal to the TDR test device; the TDR test device is configured to perform a TDR test according to the test signal generated by the predefined signal generator;
    wherein the predefined signal generator comprises: a frequency generator and a frequency-hopping pattern control module, the frequency generator configured to generate signals of preset frequencies, and a signal of a specific frequency chosen from the above signals as the test signal under a control of the frequency-hopping pattern control module.

5. The apparatus according to claim 4, further comprising: a mutual-correlation operation module, configured to perform a mutual-correlation operation for a returned signal received by the TDR test device and the test signal.

6. An apparatus for Time Domain Reflection (TDR) test of a transmission line, comprising a predefined signal generator and a TDR test device, wherein, the predefined signal generator is configured to generate a test signal according to requirement of self-correlation and mutual-correlation and feed the test signal to the TDR test device; the TDR test device is configured to perform a TDR test according to the test signal generated by the predefined signal generator;
    wherein the predefined signal generator comprises: a frequency modulator and a frequency modulation rule module, wherein the frequency modulator is configured to perform a frequency modulation in accordance with a time function output from the frequency modulation rule module, to obtain a corresponding frequency modulation signal which is taken as the test signal.

7. The apparatus according to claim 6, further comprising: a mutual-correlation operation module, configured to perform a mutual-correlation operation for a returned signal received by the TDR test device and the test signal.

8. An apparatus for Time Domain Reflection (TDR) test of a transmission line, comprising a predefined signal generator, a mutual-correction operation module and a TDR test device, wherein,
    the predefined signal generator is configured to generate a test signal according to requirement of self-correlation and mutual-correlation and feed the test signal to the TDR test device;
    the TDR test device is configured to transmit the test signal to the transmission line and receive a returned signal from the transmission line, wherein the returned signal is a superposition signal of the test signal and a reflected signal of the test signal;
    the mutual-correction operation module is configured to identify the reflected signal by performing a mutual-correlation operation for the returned signal and the test signal, and determine a test result according to the reflected signal.

9. The apparatus according to claim 8, wherein the predefined signal generator comprises: a random signal generator and a band-pass filter; wherein a random signal generated by the random signal generator is band limited by the band-pass filter and outputted as the test signal.

10. The apparatus according to claim 8, wherein the predefined signal generator comprises: a frequency generator and a frequency-hopping pattern control module, wherein the frequency generator is configured to generate signals of preset frequencies, and a signal of a specific frequency is chosen from the above signals as the test signal under a control of the frequency-hopping pattern control module.

11. The apparatus according to claim 8, wherein the predefined signal generator comprises: a frequency modulator and a frequency modulation rule module, wherein the frequency modulator is configured to perform a frequency modulation in accordance with a time function output from the frequency modulation rule module, to obtain a corresponding frequency modulation signal which is taken as the test signal.

12. The method according to claim 1, wherein the test signal has a strong self-correction and a weak mutual-correction.

13. The apparatus according to claim 8, wherein the test signal has a strong self-correction and a weak mutual-correction.

14. A digital subscriber line access multiplexer (DSLAM), comprising an apparatus for Time Domain Reflection (TDR) test of a transmission line, wherein the apparatus is configured to:

generate a test signal according to requirement of self-correlation and mutual-correlation, and transmit the test signal to the transmission line;

receive a returned signal from the transmission line, wherein the returned signal is a superposition signal of the test signal and a reflected signal of the test signal;

identify the reflected signal by performing a mutual-correlation operation for the returned signal and the test signal; and determine a test result according to the reflected signal.

15. The DSLAM according to claim 14, wherein the apparatus comprises a predefined signal generator, a mutual-correction operation module and a TDR test device, the predefined signal generator configured to generate a test signal according to requirement of self-correlation and mutual-correlation and feed the test signal to the TDR test device;

the TDR test device configured to transmit the test signal to the transmission line and receive a returned signal from the transmission line, wherein the returned signal is a superposition signal of the test signal and a reflected signal of the test signal;

the mutual-correction operation module configured to identify the reflected signal by performing a mutual-correlation operation for the returned signal and the test signal, and determine a test result according to the reflected signal.

16. The DSLAM according to claim 14, wherein the test signal has a strong self-correction and a weak mutual-correction.

17. The DSLAM according to claim 16, the test signal is a random signal, a frequency agility signal, or a regular frequency modulation signal.

18. The DSLAM according to claim 16, wherein the test signal has a weak mutual-correction with noise signals of the transmission line.

* * * * *

UNITED STATES PATENT AND TRADEMARK OFFICE
CERTIFICATE OF CORRECTION

PATENT NO. : 7,532,011 B2
APPLICATION NO. : 11/588106
DATED : May 12, 2009
INVENTOR(S) : Qingquan Shi It is certified that error appears in the above-identified patent and that said Letters Patent is hereby corrected as shown below:

On the Title Page

Item (73) Replace "TDK Corporation, Tokyo (JP)" with --Huawei Technologies Co., Ltd., Shenzhen (CN)--

Signed and Sealed this

Tenth Day of August, 2010

David J. Kappos
*Director of the United States Patent and Trademark Office*